(12) United States Patent
Lee et al.

(10) Patent No.: US 7,880,183 B2
(45) Date of Patent: Feb. 1, 2011

(54) LIGHT EMITTING DEVICE HAVING A PLURALITY OF LIGHT EMITTING CELLS AND METHOD OF FABRICATING THE SAME

(75) Inventors: Chung Hoon Lee, Gwangmyeong-si (KR); Hong San Kim, Seongnam-si (KR); James S. Speck, Santa Barbara, CA (US)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/774,525

(22) Filed: May 5, 2010

(65) Prior Publication Data
US 2010/0213468 A1 Aug. 26, 2010

Related U.S. Application Data

(63) Continuation of application No. 11/815,255, filed as application No. PCT/KR2005/002124 on Jul. 5, 2005, now Pat. No. 7,772,601.

(30) Foreign Application Priority Data

| Feb. 4, 2005 | (KR) | 10-2005-0010349 |
| Feb. 5, 2005 | (KR) | 10-2005-0010978 |
| Mar. 21, 2005 | (KR) | 10-2005-0023185 |

(51) Int. Cl.
*H01L 33/00* (2010.01)

(52) U.S. Cl. ............... 257/88; 257/99; 257/503; 257/705; 257/713; 257/E33.075; 438/34; 438/45; 438/46; 438/403

(58) Field of Classification Search .......... 257/88, 257/99, 503, 705, 713, E33.075; 438/34, 438/45, 46, 403
See application file for complete search history.

(56) References Cited

U.S. PATENT DOCUMENTS

| 6,177,685 B1 | 1/2001 | Teraguchi et al. |
| 6,403,982 B2 | 6/2002 | Carter et al. |
| 6,814,801 B2 | 11/2004 | Jenny |
| 7,417,259 B2 | 8/2008 | Sakai et al. |
| 7,772,601 B2 * | 8/2010 | Lee et al. ............ 257/88 |

(Continued)

FOREIGN PATENT DOCUMENTS

JP     61-056474     3/1986

(Continued)

OTHER PUBLICATIONS

Office Action dated May 15, 2009 (for co-pending U.S. Appl. No. 11/815,255).

(Continued)

*Primary Examiner*—Tu-Tu V Ho
(74) *Attorney, Agent, or Firm*—H.C. Park & Associates, PLC

(57) ABSTRACT

Disclosed is a light emitting device having a plurality of light emitting cells. The light emitting device comprises a thermally conductive substrate, such as a SiC substrate, having a thermal conductivity higher than that of a sapphire substrate. The plurality of light emitting cells are connected in series on the thermally conductive substrate. Meanwhile, a semi-insulating buffer layer is interposed between the thermally conductive substrate and the light emitting cells. For example, the semi-insulating buffer layer may be formed of AlN or semi-insulating GaN. Since the thermally conductive substrate having a thermal conductivity higher than that of a sapphire substrate is employed, heat-dissipating performance can be enhanced as compared with a conventional sapphire substrate, thereby increasing the maximum light output of a light emitting device that is driven under a high voltage AC power source. In addition, since the semi-insulating buffer layer is employed, it is possible to prevent an increase in a leakage current through the thermally conductive substrate and between the light emitting cells.

11 Claims, 4 Drawing Sheets

U.S. PATENT DOCUMENTS

| | | |
|---|---|---|
| 2004/0173816 A1 | 9/2004 | Saxler |
| 2005/0009310 A1 | 1/2005 | Vaudo et al. |
| 2005/0023708 A1 | 2/2005 | Chen et al. |
| 2005/0067625 A1 | 3/2005 | Hata |
| 2005/0218414 A1 | 10/2005 | Ueda et al. |
| 2005/0218416 A1 | 10/2005 | Cho et al. |
| 2005/0269671 A1 | 12/2005 | Faure et al. |
| 2006/0057749 A1 | 3/2006 | Dwilinski et al. |
| 2006/0163589 A1 | 7/2006 | Fan et al. |

FOREIGN PATENT DOCUMENTS

| | | |
|---|---|---|
| JP | 9283799 | 10/1997 |
| JP | 10-229217 | 8/1998 |
| KR | 20010008570 | 2/2001 |
| WO | 96-09653 | 3/1996 |
| WO | 2004-023568 | 3/2004 |
| WO | 2005/008791 | 1/2005 |

OTHER PUBLICATIONS

Office Action dated Oct. 9, 2009 (for co-pending U.S. Appl. No. 11/815,255).

Office Action dated Nov. 10, 2009 (for co-pending U.S. Appl. No. 12/410,101).

Sten Heikman, et al., "Growth of Fe doped semi-insulating GaN by metalorganic chemical vapor deposition", Applied Physics Letters, vol. 81, No. 3, Jul. 15, 2002, pp. 439-441.

Office Action dated Mar. 12, 2010 (for co-pending U.S. Appl. No. 11/815,255).

Office Action dated Mar. 10, 2010 (for co-pending U.S. Appl. No. 12/410,101).

\* cited by examiner

LIGHT EMITTING DEVICE HAVING A PLURALITY OF LIGHT EMITTING CELLS AND METHOD OF FABRICATING THE SAME

CROSS REFERENCE TO RELATED APPLICATIONS

This application is a continuation of prior application Ser. No. 11/815,255, filed Aug. 1, 2007, which is the National Stage of International Application No. PCT/KR2005/002124, filed on Jul. 5, 2005, and claims priority to and the benefit of Korea Patent Application No. 10-2005-0010349, filed on Feb. 4, 2005, Korea Patent Application No. 10-2005-0010978, filed on Feb. 5, 2005, and Korea Patent Application No. 10-2005-0023185, filed on Mar. 21, 2005, which are all hereby incorporated by reference for all purposes as if fully set forth herein.

BACKGROUND OF THE INVENTION

1. Field of the Invention

The present invention relates to a light emitting device and a method of fabricating the same, and more particularly, to a light emitting device having a plurality of light emitting cells serially connected in a single chip, and a method of fabricating the same.

2. Discussion of the Background

A light emitting diode is a photoelectric transformation semiconductor element in which an N-type semiconductor and a P-type semiconductor are joined together to form a junction and electrons and holes are re-combined to emit light. Such light emitting diodes are widely used as a display device and a backlight. In addition, the light emitting diode consumes less electric power as compared with conventional in-candescent bulbs or fluorescent lamps, and has an extended service life, thereby broadening its applications to general illumination purposes while replacing the conventional incandescent bulbs and fluorescent lamps.

The light emitting diode alternates between on- and off-states under an AC power source, depending on the direction of a current applied thereto. Therefore, if the light emitting diode is connected directly to an AC power source, there are problems in that it cannot emit light in a continuous mode and may be easily damaged due to a reverse current.

As an attempt to solve the above problems in the art, Sakai et al. proposed a light emitting diode capable of being connected directly to a high voltage AC power source, which is disclosed in International Publication No. WO 2004/023568A1 entitled "Light-Emitting Device Having Light-Emitting Elements."

In the publication WO 2004/023568A1, LEDs are serially connected in a two-dimensional pattern on an insulation substrate such as a sapphire substrate to form LED arrays. Two LED arrays are connected in reverse parallel on the sapphire substrate. Consequently, a single chip light emitting device that can be driven by the AC power source is provided.

However, since the sapphire substrate has a relatively low thermal conductivity, heat cannot be smoothly dissipated. This limited heat dissipation leads to a limited maximum light output of the light emitting device. Therefore, there is a need for a continuous effort to improve the maximum light output of a light emitting device under a high voltage AC power source.

SUMMARY OF THE INVENTION

An object of the present invention is to provide an improved light emitting device of which the maximum light output can be increased under a high voltage AC power source.

Another object of the invention is to provide a light emitting device having a plurality of light emitting cells serially connected to each other, wherein an increase in a leakage current through the substrate can be avoided even when an electrically conductive substrate is used.

A further object of the invention is to provide a method of fabricating an improved light emitting device of which the maximum light output can be increased under a high voltage AC power source without any increase in a leakage current through a substrate.

In order to achieve these objects, the present invention discloses a light emitting device having a plurality of light emitting cells. A light emitting device according to an aspect of the present invention comprises a thermally conductive substrate having a thermal conductivity higher than that of a sapphire substrate. A plurality of light emitting cells are connected in series on the thermally conductive substrate. Meanwhile, a semi-insulating buffer layer is interposed between the thermally conductive substrate and the light emitting cells. Since the thermally conductive substrate having a thermal conductivity higher than that of a sapphire substrate is employed, heat-dissipating performance can be improved as compared with a conventional sapphire substrate, thereby increasing the maximum light output of a light emitting device driven under a high voltage AC power source. In addition, since the semi-insulating buffer layer is used, it is possible to prevent an increase in a leakage current through the thermally conductive substrate and between the light emitting cells.

The term "thermally conductive substrate" used herein means a substrate of a material having a thermal conductivity higher than that of a sapphire substrate. In addition, the term "semi-insulating" material means a material with high resistance, which generally has a resistivity of $10^5$ Ωcm or higher and includes insulation materials unless particularly specified.

The thermally conductive substrate may be an AlN or SiC substrate. In addition, the SiC substrate may be a semi-insulating or N-type SiC substrate. The AlN and SiC substrates have a thermal conductivity which is about ten or more times as high as that of a sapphire substrate. Thus, the AlN or SiC substrate can provide a light emitting device having improved heat-dissipating performance as compared with a light emitting device employing a sapphire substrate.

The semi-insulating buffer layer may be formed of undoped AlN. The AlN has an appropriate crystal structure between the SiC substrate and a group III-nitride.

Alternatively, the semi-insulating buffer layer may be formed of semi-insulating GaN. The semi-insulating GaN may include undoped GaN or GaN doped with an acceptor. In general, undoped GaN exhibits properties of a semi-insulating or N-type semiconductor depending on the kind of substrate. In case where undoped GaN exhibits properties of an N-type semiconductor, semi-insulating GaN can be provided by doping this GaN with an acceptor.

The acceptor may be an alkaline metal, an alkaline earth metal, or a transition metal, particularly, iron (Fe). Fe can be employed to grow a semi-insulating GaN buffer layer, without affecting the structural properties of GaN.

Each of the light emitting cells includes an N-type semiconductor layer, an active layer and a P-type semiconductor layer. The N-type semiconductor layers and the P-type semiconductor layers of adjacent light emitting cells are electrically connected to one another by means of metallic wiring.

A light emitting device according to another aspect of the present invention includes a semi-insulating substrate. The semi-insulating substrate may be an AlN or SiC substrate. A plurality of light emitting cells are serially connected to one another on the semi-insulating substrate. According to this aspect, since the plurality of light emitting cells are formed directly on the AlN or semi-insulating SiC substrate, the fabricating process thereof can be simplified.

The present invention also discloses a method of fabricating a light emitting device having a plurality of light emitting cells. The method of the present invention comprises preparing a thermally conductive substrate having a thermal conductivity higher than that of a sapphire substrate. A semi-insulating buffer layer is formed on the thermally conductive substrate, and an N-type semiconductor layer, an active layer and a P-type semiconductor layer are formed on the semi-insulating buffer layer. Thereafter, the P-type semiconductor layer, the active layer and the N-type semi-conductor layer are patterned to form a plurality of light emitting cells, each of which the N-type semiconductor layer is partially exposed. Then, metallic wiring is formed to serially connect the light emitting cells in such a manner that the N-type semiconductor layer of each light emitting cell is connected to the P-type semiconductor layer of a light emitting cell adjacent thereto. Accordingly, it is possible to fabricate an improved light emitting device that can increase the maximum light output thereof under a high voltage AC power source.

The thermally conductive substrate may be an AlN substrate, or a semi-insulating or N-type SiC substrate.

DETAILED DESCRIPTION OF THE ILLUSTRATED EMBODIMENTS

Figure 1:
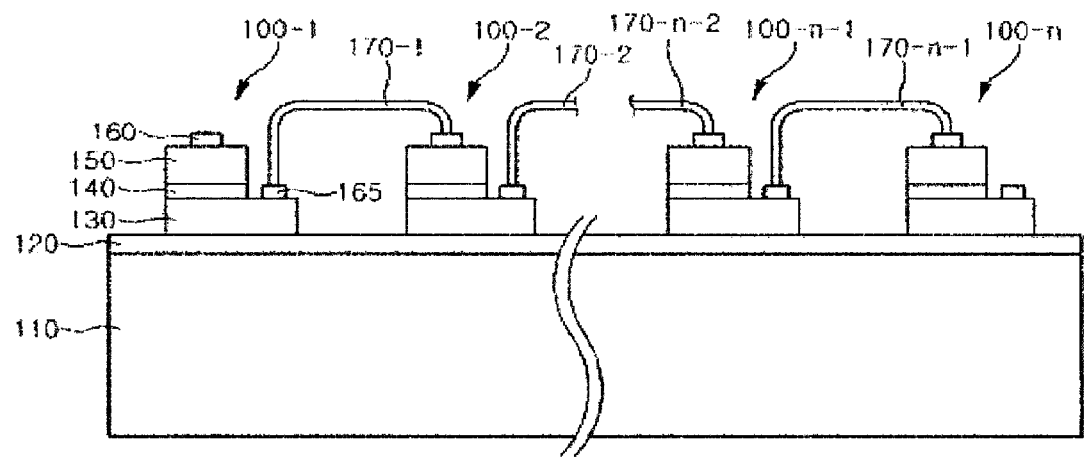
FIG. 1 is a sectional view illustrating a light emitting device having a plurality of light emitting cells according to an embodiment of the invention.

Hereinafter, embodiments of the present invention will be described in detail with reference to the accompanying drawings. The following embodiments are provided only for illustrative purposes, so that those skilled in the art can fully understand the principle of the present invention. Thus, the present invention is not limited to the embodiments set forth herein but may be implemented in many different configurations. In the drawings, the width, length, thickness and the like of each component may be exaggerated for convenience and clarity of illustration. Like reference numerals indicate like elements throughout the description.

FIG. 1 is a sectional view illustrating a light emitting device with a plurality of light emitting cells serially connected to one another according to an embodiment of the invention.

Referring to FIG. 1, the light emitting device of the present invention comprises a thermally conductive substrate 110, a buffer layer 120 formed on the substrate 110, a plurality of light emitting cells 100-1 to 100-n patterned on the buffer layer 120, and metallic wiring 170-1 to 170-n−1 for serially connecting the plurality light emitting cells 100-1 to 100-n to each other.

The thermally conductive substrate 110 is a substrate of a material that has a thermal conductivity relatively higher than that of a sapphire substrate. The thermally conductive substrate 110 may be an AlN substrate or a semi-insulating or N-type SiC substrate.

The buffer layer 120 is used for alleviating lattice-mismatch between the substrate 110 and semiconductor layers to be formed thereon. In addition, in some embodiments of the present invention, the buffer layer 120 may be employed to insulate the light emitting cells 100-1 to 100-n from the substrate 110. Furthermore, the light emitting cells should be electrically isolated from one another. Thus, the buffer layer 120 is formed of a semi-insulating material film. In a case where the substrate 110 is a semi-insulating AlN substrate or semi-insulating SiC substrate, the buffer layer 120 may be omitted.

In this embodiment, the semi-insulating buffer layer 120 may be an AlN or semi-insulating GaN layer. Since undoped AlN generally has an insulation property, undoped AlN may be used as the AlN. Meanwhile, undoped GaN generally exhibits properties of an N-type semiconductor or a semi-insulation property, depending on the growth process and the substrate material. Therefore, in case where undoped GaN has a semi-insulation property, undoped GaN becomes the semi-insulating GaN. On the other hand, if the undoped GaN exhibits the properties of an N-type semiconductor, doping is made with an acceptor for compensation. The acceptor may include an alkaline metal, an alkaline earth metal, or a transition metal, particularly, iron (Fe) or chromium (Cr).

A method of forming a semi-insulating GaN layer on a sapphire substrate is disclosed in "Growth of Fe doped semi-insulating GaN by metalorganic chemical vapor deposition" by Heikman et al., in Applied Physics Letters published on Jul. 15, 2002. Heikman et al. used an MOCVD technique using ferrocene ($Cp_2Fe$) as a precursor in order to form a semi-insulating GaN layer on a sapphire substrate.

Generally, undoped GaN formed on a sapphire substrate using the MOCVD technique is N-type GaN. This is because remaining oxygen atoms act as donors in a GaN layer. Thus, doping is made with a metallic material such as Fe, which acts as an acceptor, to compensate the donor, thereby forming semi-insulating GaN.

The technique by which doping is made with an acceptor to form a semi-insulating GaN can be identically applied in the embodiments of the present invention. For example, undoped GaN formed on a SiC substrate can become N-type GaN by impurities such as Si. Thus, the semi-insulating GaN buffer layer 120 can be formed by performing doping with a metallic material such as Fe. Here, the entire thickness of the semi-insulating buffer layer 120 is not necessarily required to be doped with the acceptor. The doping may be made with an acceptor such as Fe to the partial thickness of the buffer layer 120.

Also, the acceptor can be doped by an ion implantation technique.

The semi-insulating buffer layer 120 may be continuous between the light emitting cells 100-1 to 100-n, as illustrated, but may be discrete therebetween.

Meanwhile, each of the light emitting cells 100-1 to 100-n includes a PN junction nitride semiconductor layer.

In this embodiment, each of the light emitting cells includes an N-type semi-conductor layer 130, an active layer 140 formed on a predetermined area of the N-type semiconductor layer 130, and a P-type semiconductor layer 150 formed on the active layer 140. An upper surface of the N-type semiconductor layer 130 is exposed at least partially. Ohmic metal layer 160 and 165 may be formed on the N-type semiconductor layer 130 and the P-type semiconductor layer 150. In addition, an N-type semi-conductor tunneling layer with a high concentration of $1\times10^{19}\sim1\times10^{22}/cm^3$ or semimetal layer may be formed on the N-type semiconductor layer 130 or the P-type semi-conductor layer 150. A transparent electrode layer (not shown) may also be further formed on the N-type semiconductor tunneling layer or semi-metal layer.

The N-type semiconductor layer 130 is an N-type $Al_xIn_yGa_{1-x-y}N$ ($0\leqq x, y\leqq 1$) film and may include an N-type clad layer. In addition, the P-type semiconductor layer 150 is a P-type $Al_xIn_yGa_{1-x-y}N$ ($0\leqq x, y\leqq 1$) film and may include a P-type clad layer.

The N-type semiconductor layer 130 can be formed through silicon-doping, and the P-type semiconductor layer 150 may be formed through zinc- or magnesium-doping.

The active layer 140 is a region where electrons and holes are recombined and includes InGaN. Depending on the material forming the active layer 140, the wavelength of light emitted from the light-emitting cell is determined. The active layer 140 may be a multi-layered film in which quantum-well layers and barrier layers are alternately formed. The barrier layer and the quantum-well layer may be binary to quaternary compound semiconductor layers which can be expressed in a general formula $Al_xIn_yGa_{1-x-y}N$ ($0\leqq x,y,x+y\leqq 1$).

The light emitting cells are connected in series by means of the metallic wiring 170-1 to 170-n-1. In this embodiment, a number of light emitting cells 100-1 to 100-n that can be driven by an AC power source are connected in series by means of the metallic wiring. That is, the number of serially connected light-emitting cells 100 is limited by an AC driving voltage/current applied to the light emitting device and a voltage required to drive a single light-emitting cell. For example, in the case of a 3.3V-driven light emitting cell, about 67 cells can be serially connected under an AC voltage of 220V. In addition, approximately 34 cells can be connected in series under an AC voltage of 110V.

As illustrated in FIG. 1, in the light emitting device where n light emitting cells 100-1 to 100-n are serially connected, the N-type semiconductor layer 130 of the first light emitting cell 100-1 and the P-type semiconductor layer 150 of the second light emitting cell 100-2 are connected through the first metallic wiring 170-1. The N-type semiconductor layer 130 of the second light emitting cell 100-2 and the P-type semi-conductor layer (not shown) of the third light emitting cell (not shown) are connected through the second metallic wiring 170-2. Moreover, the N-type semiconductor layer (not shown) of the (n−2)-th light emitting cell (not shown) and the P-type semi-conductor layer 150 of the (n−1)-th light emitting cell 100-n−1 are connected through the (n−2)-th metallic wiring 170-n−2. The N-type semiconductor layer 130 of the (n−1)-th light emitting cell 100-n−1 and the P-type semiconductor layer 150 of the n-th light emitting cell 100-n are connected through the (n−1)-th metallic wiring 170-n−1.

The above serially connected light emitting cells constitute an LED array, as disclosed in International Publication No. WO 2004/023568A1. In the meantime, the light emitting device may have two LED arrays, which are connected to each other in reverse-parallel, to be used for illumination under an AC power source. The P-type semiconductor layer 150 of the first light emitting cell 100-1 and the N-type semiconductor layer 130 of the n-th light emitting cell 100-n may be formed with a P-type pad and an N-type pad (not shown) for electrical connection to the AC power source, respectively.

Figure 2:
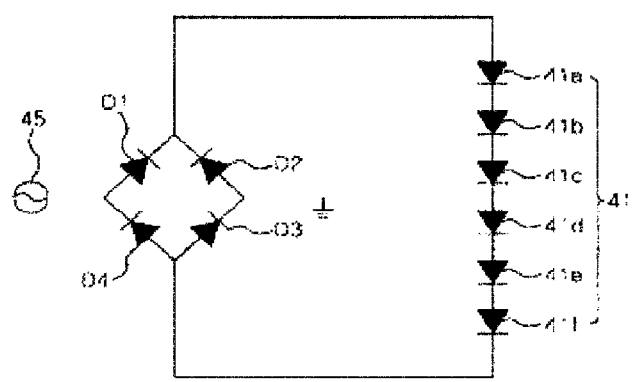
FIG. 2 is a circuit diagram illustrating a light emitting device including a bridge rectifier according to an embodiment of the invention.

Alternatively, the light emitting device may include a bridge rectifier consisting of diodes in order to rectify an AC current. FIG. 2 shows a circuit diagram of a light emitting device including a bridge rectifier.

Referring to FIG. 2, an LED array 41 includes light emitting cells 41a, 41b, 41c, 41d, 41e and 41f serially connected to one another. A bridge rectifier comprising diodes D1, D2, D3 and D4 is disposed between an AC power source 45 and the LED array 41 and between a ground and the LED array 41. The diodes D1, D2, D3 and D4 may be formed by means of the same process as of the light emitting cells. That is, the bridge rectifier can be fabricated with the light emitting cells.

An anode terminal of the LED array 41 is connected to a node between the diodes D1 and D2, and a cathode terminal thereof is connected to a node between the diodes D3 and D4. Meanwhile, a terminal of the AC power source 45 is connected to a node between the diodes D1 and D4, and the ground is connected to a node between the diodes D2 and D3.

If the AC power source 45 has a positive phase, the diodes D1 and D3 of the bridge rectifier are turned on and the diodes D2 and D4 are turned off. Thus, a current flows to the ground via the diode D1 of the bridge rectifier, the LED array 41, and the diode D3 of the bridge rectifier.

On the other hand, if the AC power source 45 has a negative phase, the diodes D1 and D3 of the bridge rectifier are turned off and the diodes D2 and D4 thereof are turned on. Thus, the current flows to the AC power source via the diode D2 of the bridge rectifier, the LED array 41, and the diode D4 of the bridge rectifier.

Consequently, the connection of the bridge rectifier to the LED array 41 enables the AC power source 45 to continuously drive the LED array 41. The terminals of the bridge rectifier are configured to be connected to the AC power source 45 and the ground, as shown in FIG. 2. But, the terminals of the bridge rectifier may be configured to be connected to both terminals of the AC power source.

According to this embodiment, a single LED array can be driven by being electrically connected to an AC power source, thereby improving the efficiency of use of the LED array.

Next, a method of fabricating a light-emitting device having a plurality of light emitting cells will be described.

FIGS. 3 to 7 are sectional views illustrating a method of fabricating a light emitting device having a plurality of light emitting cells according to an embodiment of the invention.

Figure 3:
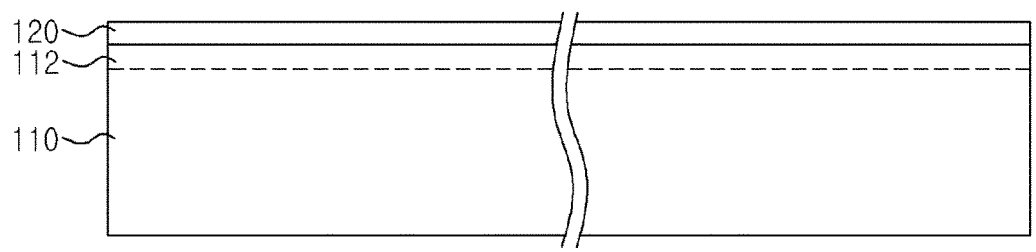
FIGS. 3 to 7 are sectional views illustrating a method of fabricating a light emitting device having a plurality of light emitting cells according to an embodiment of the invention.

Referring to FIG. 3, a semi-insulating buffer layer 120 is formed on a thermally conductive substrate 110. The thermally conductive substrate 110 may be an AlN or SiC substrate. In addition, the SiC substrate may be a semi-insulating or N-type substrate.

In general, a single crystal SiC substrate exhibits properties of an N-type semi-conductor. It is known that this is because nitrogen contained in the SiC substrate acts as an donor. Thus, doping is made with an acceptor such as vanadium (V) to grow a semi-insulating SiC single crystal. Meanwhile, U.S. Pat. No. 6,814,801 discloses a method of growing a semi-insulating SiC crystal without doping with vanadium. These techniques can be used to provide a semi-insulating SiC substrate. On the other hand, an acceptor such as Fe, V, C or Si can be injected into a SiC substrate using an ion implantation technique to convert the upper part of the SiC substrate into a semi-insulating SiC layer 112.

The semi-insulating buffer layer 120 is formed through a metalorganic chemical vapor deposition (MOCVD) method, molecular beam epitaxy (MBE) method, a hydride vapor phase epitaxy (HVPE) method, or the like. The buffer layer 120 may be an AlN or semi-insulating GaN layer. The semi-insulating GaN layer may be an undoped GaN layer or a GaN layer doped with an acceptor. The acceptor may be an alkaline metal, an alkaline earth metal or a transition metal, particularly, iron (Fe) or chromium (Cr). The acceptor can be doped using a deposition technique with precursors during the formation of the GaN layer, or using an ion implantation technique after the formation of the GaN layer.

In the case of using an N-type SiC substrate, the semi-insulating buffer layer 120 electrically insulates the light emitting cells from the N-type SiC substrate to prevent a leakage current through the substrate. On the other hand, in the case of using a semi-insulating SiC substrate, the process of forming the semi-insulating buffer layer 120 can be omitted.

Figure 4:
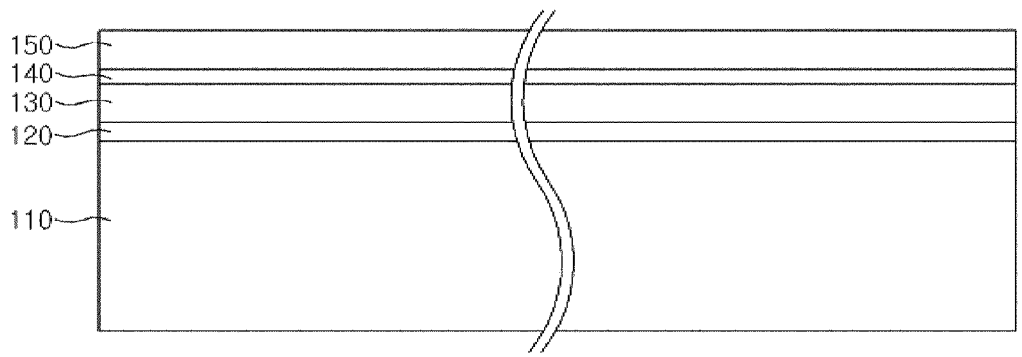

Referring to FIG. 4, an N-type semiconductor layer 130, an active layer 140 and a P-type semiconductor layer 150 are formed on the semi-insulating buffer layer 120. These semiconductor layers 130, 140 and 150 can be formed continuously within one processing chamber. The N-type semiconductor layer 130, the active layer 140 and the P-type semiconductor layer 150 can be formed using the MOCVD method, the MBE method, or the HVPE method, and each of the layers may be formed in a multi-layer. An N-type semiconductor tunneling layer with a high concentration of $1 \times 10^{19} \sim 1 \times 10^{22}/cm^3$ or semi-metal layer may be formed on the N-type semiconductor layer 130 and/or the P-type semiconductor layer 150, a transparent electrode layer (not shown) may also be further formed on the N-type semiconductor tunneling layer or semi-metal layer.

Figure 5:
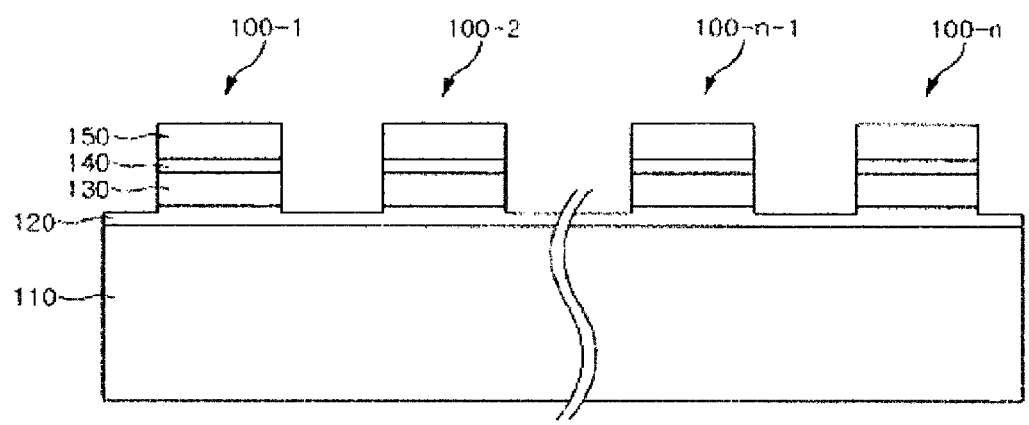

Referring to FIG. 5, the P-type semiconductor layer 150, the active layer 140 and the N-type semiconductor layer 130 are patterned to form discrete light emitting cells 100-1 to 100-n. The layers can be patterned using a photolithographic and etching technique. For example, a photoresist pattern is formed on the P-type semiconductor layer 150, and the P-type semiconductor layer 150, the active layer 140 and the N-type semiconductor layer 130 are then etched in sequence using the photoresist pattern as an etching mask. Accordingly, the discrete light emitting cells are formed. At this time, the semi-insulating buffer layer 120 may be etched to expose the substrate 110.

Figure 6:
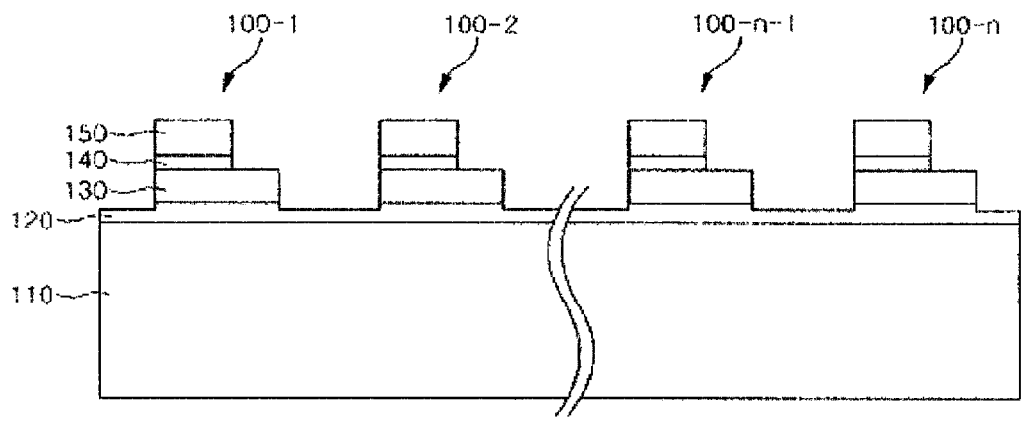

Referring to FIG. 6, an upper surface of the N-type semiconductor layer 130 is partially exposed by patterning the P-type semiconductor layer 150 and the active layer 140 of each of the discrete light emitting cells 100-1 to 100-n. This patterning process can be carried out using a photolithographic and etching technique. That is, a photoresist pattern is formed on the substrate 110 having the discrete light emitting cells 100-1 to 100-n, and the P-type semiconductor layer 150 and the active layer 140 are partially etched using the photoresist pattern as an etching mask. Consequently, the etched portions of the P-type semiconductor layer and the active layer enable the partial exposure of the N-type semiconductor layer 130.

This etching process can be performed through a wet or dry etching process. The dry etching process may be a plasma dry etching process.

Figure 7:
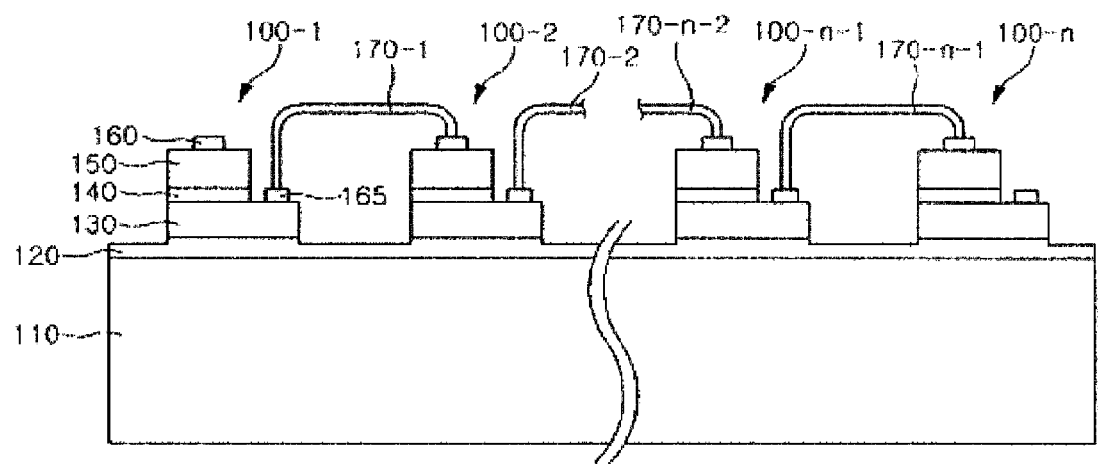

Referring to FIG. 7, a P-type ohmic metal layer 160 and an N-type ohmic metal layer 165 are formed on the P-type semiconductor layer 150 and the N-type semiconductor layer 130, respectively.

The ohmic metal layers 160 and 165 can be formed by opening regions where the ohmic metal layers 160 and 165 will be formed using a photoresist pattern (not shown) and performing a metal deposition process. The P-type ohmic metal layer 160 and the N-type ohmic metal layer 165 may be formed through the same process or separate respective processes. The ohmic metal layers 160 and 165 may be formed of at least one selected from Pb, Sn, Au, Ge, Cu, Bi, Cd, Zn, Ag, Ni and Ti.

Thereafter, the N-type ohmic metal layers 165 and the P-type ohmic metal layers 160 of adjacent light emitting cells are connected using metallic wiring 170-1 to 170-n-1. The metallic wiring can be formed through an air bridge process or a step-cover process.

The air bridge process is disclosed in International Publication No. WO 2004/023568A1 and will be briefly described. First, a first photoresist pattern with openings through which portions of the ohmic metal layers 160 and 165 are exposed is formed on the substrate provided with the light emitting cells and the ohmic metal layers 160 and 165. Then, a thin metallic layer is formed using an e-beam evaporation technique. The metallic layer is formed over the openings and the entire upper surface of the first photoresist pattern. Thereafter, a second photoresist pattern is formed to expose regions between adjacent light emitting cells to be connected, and the metallic layer on the openings. Subsequently, gold or the like is plated and the first and second photoresist patterns are then removed using a solution such as a solvent. As a result, only wiring for connecting adjacent light emitting cells is left, and the remaining metallic layer and the photoresist patterns are fully removed.

On the other hand, the step-cover process includes forming an insulation layer on the substrate having the light emitting cells and the ohmic metal layers. The insulation layer is patterned using a photolithographic and etching technique to form openings through which the ohmic metal layers 160 and 165 on the P- and N-type semiconductor layers are exposed. Then, an e-beam evaporation technique is employed to fill the openings and form a metallic layer for covering the insulation layer. Thereafter, the metallic layer is patterned using a photolithographic and etching technique to form wiring for connecting neighboring light emitting cells to each other. Various modifications to this step-cover process can be made. When the step-cover process is used, the insulation layer supports the wiring, thereby improving the reliability of the wiring.

Thereafter, a P-type pad and an N-type pad for electrical connection to an AC power source are formed at the light emitting cells 100-1 and 100-n located at both distal ends.

Although the light emitting cells are illustrated as being arranged in a straight line in the drawings, this is only to ensure convenience of explanation. The light emitting cells may be arranged on a plane in various patterns and configurations, as shown in International Publication No. WO 2004/023568A1.

According to the present invention, the heat-dissipating performance of a light emitting device can be enhanced. Thus, it is possible to provide a light emitting device having increased maximum output under a high voltage AC power source. Furthermore, it is possible to provide a light emitting device having a plurality of light emitting cells and employing a semi-insulting substrate or a semi-insulating buffer layer to prevent an increase in a leakage current through the substrate.

The invention claimed is:

1. A light emitting device having a plurality of light emitting cells, comprising:
    a thermally conductive substrate having a thermal conductivity higher than that of a sapphire substrate;
    a plurality of light emitting cells serially connected to one another on the thermally conductive substrate; and
    a semi-insulating buffer layer interposed between the thermally conductive substrate and the light emitting cells,
    wherein the thermally conductive substrate comprises AlN or an N-type SiC substrate, and
    wherein the semi-insulating buffer layer is partially doped with an acceptor.

2. The device of claim 1, wherein the semi-insulating buffer layer is formed of AlN.

3. The device of claim 1, wherein the semi-insulating buffer layer is formed of semi-insulating GaN.

4. The device of claim 3, wherein the semi-insulating GaN is GaN doped with the acceptor.

5. The device of claim 1, wherein each of the light emitting cells comprises an N-type semiconductor layer, an active layer, and a P-type semi-conductor layer, and the N-type semiconductor layer and the P-type semi-conductor layer of adjacent light emitting cells are electrically connected in series by means of metallic wiring.

6. The device of claim 1, wherein the semi-insulating buffer layer is continuously disposed between each of the light emitting cells.

7. A method of fabricating a light emitting device, comprising:

forming a thermally conductive substrate comprising AlN or an N-type SiC substrate;

forming a semi-insulating buffer layer on the thermally conductive substrate;

forming an N-type semiconductor layer, an active layer, and a P-type semi-conductor layer on the semi-insulating buffer layer;

patterning the P-type semiconductor layer, the active layer, and the N-type semi-conductor layer to form a plurality of light emitting cells, each of the light emitting cells having a partially exposed N-type semiconductor layer; and forming metallic wiring serially connecting the light emitting cells in such a way that the N-type semiconductor layer of each of the light emitting cells is connected to the P-type semiconductor layer of a light emitting cell adjacent thereto, and wherein forming the semi-insulating buffer layer comprises doping an acceptor to a partial thickness of the semi-insulating buffer layer.

8. The method of claim 7, wherein the semi-insulating buffer layer is formed of AlN.

9. The method of claim 7, wherein the semi-insulating buffer layer is formed of semi-insulating GaN.

10. The method of claim 9, wherein the semi-insulating GaN is GaN doped with the acceptor.

11. The method of claim 10, wherein the acceptor is doped using an ion implantation technique.

* * * * *